(12) United States Patent
Sugawara

(10) Patent No.: US 8,848,472 B2
(45) Date of Patent: Sep. 30, 2014

(54) FABRICATION AND TESTING METHOD FOR NONVOLATILE MEMORY DEVICES

(71) Applicant: Samsung Electronics Co., Ltd., Suwon-Si (KR)

(72) Inventor: Hiroshi Sugawara, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 13/711,850

(22) Filed: Dec. 12, 2012

(65) Prior Publication Data

US 2013/0155796 A1    Jun. 20, 2013

(30) Foreign Application Priority Data

Dec. 15, 2011  (JP) ................................ 2011-274481
Nov. 5, 2012   (KR) ........................ 10-2012-0124140

(51) Int. Cl.
| G11C 5/02  | (2006.01) |
| G11C 5/06  | (2006.01) |
| G11C 7/00  | (2006.01) |
| H01L 21/66 | (2006.01) |
| G11C 29/00 | (2006.01) |
| G01R 31/27 | (2006.01) |
| G11C 29/08 | (2006.01) |
| G11C 29/12 | (2006.01) |
| G11C 29/26 | (2006.01) |
| G11C 5/04  | (2006.01) |
| G11C 16/00 | (2006.01) |
| G11C 16/04 | (2006.01) |

(52) U.S. Cl.
CPC .............. *H01L 22/00* (2013.01); *G11C 29/006* (2013.01); *G01R 31/275* (2013.01); *G11C 5/02* (2013.01); *G11C 5/025* (2013.01); *G11C 5/06* (2013.01); *G11C 29/08* (2013.01); *G11C 5/04* (2013.01); *H01L 22/32* (2013.01); *G11C 16/00* (2013.01); *G11C 16/0483* (2013.01); *G11C 29/12005* (2013.01); *G11C 29/26* (2013.01); *G11C 2029/1206* (2013.01); *H01L 2224/48091* (2013.01); *H01L 2224/49113* (2013.01)
USPC ................................ 365/201; 365/51; 365/63

(58) Field of Classification Search
CPC ........ G11C 29/08; G11C 29/006; G11C 5/06; G11C 5/02; G11C 5/04; G11C 5/025; H01L 25/0657
USPC ....................... 365/51, 63, 201, 191
See application file for complete search history.

(56) References Cited

U.S. PATENT DOCUMENTS

| 2007/0007983 A1* | 1/2007 | Salmon ......................... 324/765 |
| 2011/0234899 A1  | 9/2011 | Kobayashi |
| 2011/0292708 A1* | 12/2011 | Kang et al. ...................... 365/63 |

FOREIGN PATENT DOCUMENTS

JP     2009-003991     1/2009

OTHER PUBLICATIONS

Ishida et al., "A 1.8V 30nJ Adaptive rogram-Voltage (20V) Generator for 3D-Integrated NAND Flash SSD," 2009 IEEE International Solid-State Circuits Conference, pp. 238-240.

*Primary Examiner* — Ly D Pham
(74) *Attorney, Agent, or Firm* — Volentine & Whitt, PLLC

(57) ABSTRACT

A plurality of master chips are arranged in a row on the wafer, each master chip including a power supply circuit providing a power supply voltage, and a plurality of slave chips are arranged in a column to at least one side of a corresponding master chip among the plurality of master chips, each slave chip including a memory cell array functionally operative in response to the power supply voltage provided by the corresponding master chip during wafer level testing.

19 Claims, 3 Drawing Sheets

FABRICATION AND TESTING METHOD FOR NONVOLATILE MEMORY DEVICES

CROSS-REFERENCE TO RELATED APPLICATIONS

This U.S. non-provisional patent application claims priority under 35 U.S.C. §119 to Korean Patent Application No. 10-2012-0124140 filed on Nov. 5, 2012, and Japanese Patent Application No. 2011-274481 filed on Dec. 15, 2011, the collective subject matter of which is hereby incorporated by reference.

BACKGROUND

The inventive concept relates generally to nonvolatile memory devices and methods of fabricating and testing same.

Conventionally, a memory system including a plurality of nonvolatile memory chips (e.g., a solid state drive (SSD)) has been configured in such a way that each of the nonvolatile memory chips includes a peripheral circuit, such as a power circuit. In case where a power chip provided on a system board is used to replace the power circuits of the individual nonvolatile memory chips, it is possible to reduce an area for the power circuit in each nonvolatile memory chip. In addition, it is possible to reduce power consumption.

For example, as disclosed in Japanese Patent Publication No. 2009-3991 and in Ishida et al., *A 1.8V 30nJ adaptive program-voltage (20V) generator for 3D-integrated NAND flash SSD*, pp. 238-39, IEEE International Solid State Circuits Conf., ISSCC 2009, Digest of Technical Papers, San Francisco, Calif., USA (8-12 Feb. 2009), a memory system may be provided as a multi-chip package in which a plurality of nonvolatile memory chips lacking a power circuit, and a power (or master) chip having a power circuit are stacked one over the other. In this configuration, the power chip is provided on a system board and is used as a common circuit. The power chip and the plurality of the nonvolatile memory chips are connected using through-silicon-vias (TSV) and bonding wires.

In the case of the memory system disclosed in Japan Patent Publication No. 2009-3991 and the Ishida's article, the nonvolatile memory chips are configured without a power circuit, but this leads to certain technical difficulties in the testing of the nonvolatile memory chips. For example, in order to execute certain test processes, the nonvolatile memory chips must be connected to the power chip by an external tester in order to obtain the required operating voltage(s) necessary for testing. Alternately, each nonvolatile memory chip must be at least partially packaged before testing can be performed.

Since the provision of certain high voltages and complicated control timing is usually needed to test nonvolatile memories, such as NAND flash memories, very expensive testing apparatuses are required and difficult, time consuming testing is required. This drives up manufacturing costs.

In addition, where testing is performed only after packaging of the nonvolatile memory chips, or even final packaging of the memory system, a single "bad" nonvolatile memory chip will cause the memory system to fail. This also drives up manufacturing costs.

SUMMARY

Embodiments of the inventive concept generally provide fabrication methods for semiconductor devices capable of reducing testing and manufacturing costs.

In one embodiment, the inventive concept provides a semiconductor wafer, comprising; a plurality of master chips arranged in a row on the wafer, each master chip including at least one master control circuit that provides at least one control signal, and a plurality of slave chips arranged in a column to at least one side of a corresponding master chip among the plurality of master chips, each slave chip including a slave control circuit responsive to the at least one control signal provided by the corresponding master chip during wafer level testing.

In another embodiment, the inventive concept provides a semiconductor wafer, comprising; a plurality of master chips arranged in a row on the wafer, each master chip including a power supply circuit provides a power supply voltage, and a plurality of slave chips arranged in a column to at least one side of a corresponding master chip among the plurality of master chips, each slave chip including a memory cell array functionally operative in response to the power supply voltage provided by the corresponding master chip during wafer level testing.

In another embodiment, the inventive concept provides a method of fabricating semiconductor devices, comprising; fabricating a plurality of master chips arranged in a row on a wafer, wherein each master chip includes a master control circuit that provides a control signal, and fabricating a plurality of slave chips arranged in a column to at least one side of a corresponding master chip among the plurality of master chips on the wafer, wherein each slave chip includes a slave control circuit responsive to the control signal provided by the corresponding master chip, wherein the fabricating the plurality of master chips and fabricating the plurality of slave chips is performed by a common set of fabrication processes.

BRIEF DESCRIPTION OF THE DRAWINGS

Certain embodiments of the inventive concept are described hereafter with reference to accompanying drawings.

Figure 1:
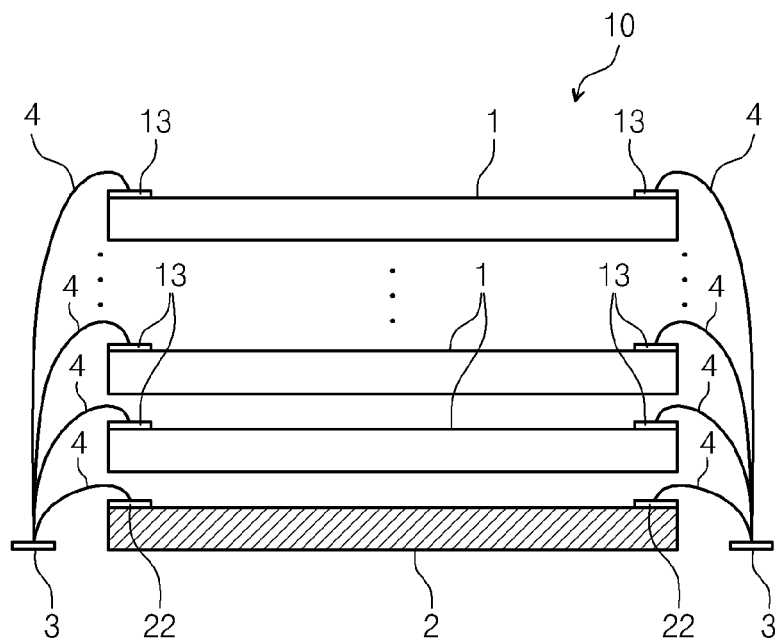
FIG. 1 is a lateral perspective view illustrating a nonvolatile memory device according to certain embodiments of the inventive concept.

It should be noted that these figures are intended to illustrate the general characteristics of methods, structure and/or materials utilized in certain example embodiments and to supplement the written description provided below. The figures are not drawn to scale and may not reflect the precise structural or performance characteristics of any given embodiment. The particular details illustrated in the drawings should not be interpreted as defining or limiting the range of values and/or properties encompassed by example embodiments. For example, the relative thicknesses of structural elements may be reduced or exaggerated for clarity. The use of similar or identical reference numbers in the various drawings is intended to indicate the presence of a similar or identical element or feature.

DETAILED DESCRIPTION

Certain embodiments of the inventive concepts will now be described in some additional detail with reference to the accompanying drawings. Embodiments of the inventive concepts may, however, be embodied in many different forms and should not be construed as being limited to only the illustrated embodiments. Rather these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments of the inventive concept are described herein with reference to cross-sectional illustrations that are schematic illustrations of idealized embodiments and/or intermediate structures. As such, variations in the shape of the illustrations, such as those occurring as the result of manufacturing variations and/or tolerances, may be expected. Thus, the scope of the inventive concept should not be construed as being limited to only the particular region and/or element shapes in the accompanying drawings.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure (FIG.) 1 is a lateral perspective view illustrating a nonvolatile memory device according to certain embodiments of the inventive concept. Referring to FIG. 1, a nonvolatile memory device 10 comprises a multi-chip package including at least one (e.g., a plurality of) slave chip 1 and a master chip 2. In certain embodiments, the master chip 2 will include at least one power supply circuit configured to supply one or more power voltages each one of the slave chips 1. In certain embodiments, each slave chip 1 may include a memory cell array.

The nonvolatile memory device 10 further comprises a plurality of first connection pads 13 (e.g., arranged in a first connection pad area) that may be used to electrically connect circuits and elements on each slave chip 1, and a plurality of second connection pads 22 (e.g., arranged in a second connection pad area) that may be similarly used to connect circuits and elements on the master chip 2. For example, the individual connection pads 13 and 22 may serve as respective connection terminals for the slave chips 1 and master chip 2.

As shown in FIG. 1, the connection pads 13 and 22 may be connected to one or more connection points 3 located off the slave chips 1 and master chip 2. Such connection points may be a bonding pad or region provided by a package substrate or lead frame (not shown). Respective connecting elements 4 serving as electrical pathways established between connection pads 13 and 22 and the various connection points 3 may be implemented as one or more of a bonding wire, a vertical electrode, and through-via, etc. Those skilled in the art will recognize that the structure of the multi-chip package shown in FIG. 1 is merely exemplary. Other structures and configurations of the multi-chip package are possible according to various conventionally understood modification and packaging techniques.

In the nonvolatile memory device 10, the master chip 2 may be one chip fabricated in a row of chips on a semiconductor wafer. In this regard, and consistent with certain embodiments, the slave chips 1 may be fabricated on the wafer adjacent or proximate to the master chip 2. For example, one row of chips fabricated on a wafer may include a master chip 2 and one or more slave chips 1. The slave chips 1 may be arranged to one side of the master chip 2 on the wafer, or to both sides of the master chip 2 on the wafer. Multiple, parallel rows of chips may be formed on the wafer including a master chip 2 and at least one slave chip 1 in each row, or including only a plurality of slave chips 1. In certain embodiments, each slave chip 1 may be connected to at least one other slave chip 1 via (e.g.) an uppermost wiring layer. In certain embodiments, the inter-slave-chip connection direction will be a direction orthogonal to an arrangement direction of multiple master chips 2 on the wafer.

As noted above, one or more of the slave chips 1 may include a memory cell array, and the memory cell array may be configured to operate in response to one or more power voltage(s) provided by the master chip 2.

In certain embodiments, the master chip 2 may have a same width as each one of the slave chips 1, where is slave chip is assumed to be substantially identical in its fabrication.

Figure 2:
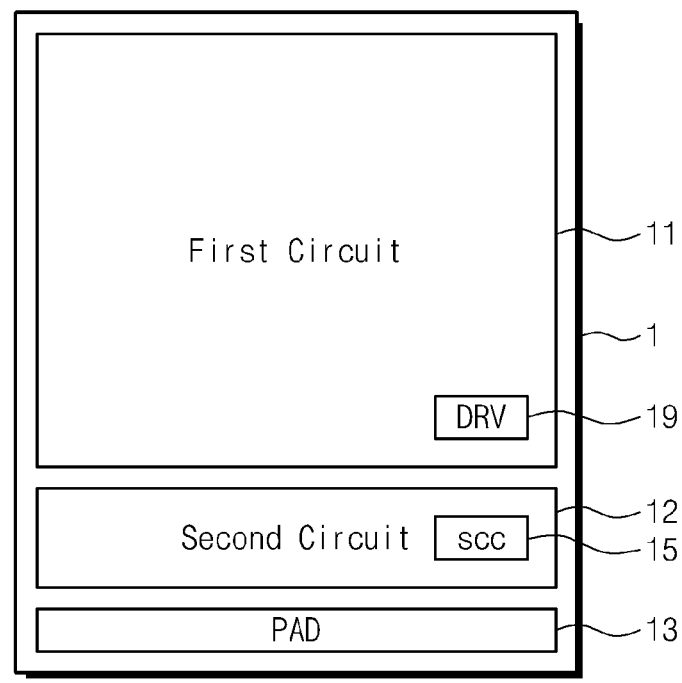
FIG. 2 is a plan view further illustrating the slave chip of FIG. 1.

FIG. 2 is a plan view further illustrating a slave chip 1 of FIG. 1. Referring to FIG. 2, each slave chips 1 comprises a first circuit block 11, a second circuit block 12, and a connection pad area 13.

The first circuit block 11 may include (e.g.) a memory cell array, a row decoder, a sense amplifier circuit, and/or a page buffer. The memory cell array may be configured to have a plurality of memory cells. The row decoder may be configured to select and operate word lines of the memory cell array, each of which is connected to a plurality of the memory cells (e.g., serving as control gates). The sense amplifier circuit may be configured to amplify and sense electric signals corresponding to data values stored in the respective memory cells. The page buffer may be configured to temporarily store (e.g.) page-size data to be written to or read from a plurality of the memory cells during program or read operations. Hereafter, the various conventionally understood circuits used to write data to a memory cells array and read data from the memory cell array (e.g., decoders, sense amplifiers, etc.) will be collectively and individually terms "driving circuits" (DRV) 19.

The second circuit block 12 may include a slave control circuit (SCC) 15, an address decoder, a column redundancy circuit block, and/or a block redundancy circuit. The slave control circuit 15 may be configured to control the exchange of various controls signals and data signals with one or more master control circuits (MCC) 17 located on the master chip 2. (See, FIG. 3). For example, a slave control circuit 15 may be configured to generate control signals that control particular circuitry and/or internal portions (such as the various driving circuits 19) of a slave chip 1. Various control signals are exchanged between the slave chip 1 and master chip 2 during different operations that cause the various driving circuits 19 to operate in conventionally understood ways in relation to memory cells of the memory cell array. For example, an address decoder may be configured to decode an address signal provided by the master chip 2 in response to various control signals. In its operation, the address decoder will generate certain selection signals that select one or more memory cell(s) indicated by the address signal. In another example, a column redundancy circuit (another type of driving circuit) may be configured to perform an address conversion for selecting each bit of the memory cells in response to control signals received from the master chip 2. Similarly, a block redundancy circuit (another type of driving circuit) may be configured to perform an address conversion for selecting each block (i.e., a data unit for an erase operation) of the memory cells in response to other control signals provided by the master chip 2.

Within this configuration of the first circuit block 11 and second circuit block 12, the connection pad area 13, including a number of connections pads, serves as an area wherein control signals are exchanged via connection terminals connected to at least one other chip in the multi-chip package.

Figure 3:
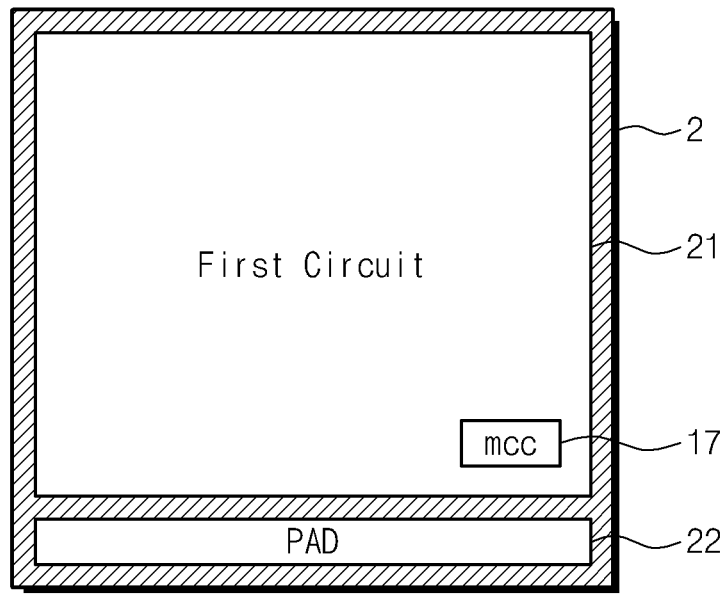
FIG. 3 is another plan view further illustrating the master chip of FIG. 1.

FIG. 3 is a plan view further illustrating the master chip 2 of FIG. 1. Referring to FIG. 3, the master chip 2 comprises a first circuit block 21 including one or more master control circuits (MCC) 17 and a connection pad area 22. The first circuit block 21 may be configured to include certain master control circuit(s) 17, such as (e.g.) a command decoder, a scheduler, an address decoder, and/or a power circuit. The master control circuits are variously configured to generate control signals in response to (e.g.) one or more command(s) and corresponding address and data signals received from an external source and identifying operations to be performed by driving circuits 19 of one or more of the slave chips 1.

For example, the command decoder may be configured to decode received commands provide from an external device (e.g., tester), and to transmit the decoded command to various master control circuit(s) 17. The scheduler may be configured to generate control signals used to control the timing or execution sequence of different operations by driving circuits 19 of the slave chips 1. The address decoder may be configured to decode externally provided address signals and transmit the decoded address signals to various master control circuit(s) 17. The power circuit may be configured to generate certain control voltages that are conventionally used during read, write and erase operations directed to one or more memory cell arrays of the slave chips 1.

The connection pad area 22 includes a number of connections pads that serve as connection terminals to other chips in the multi-chip package.

Figure 4:
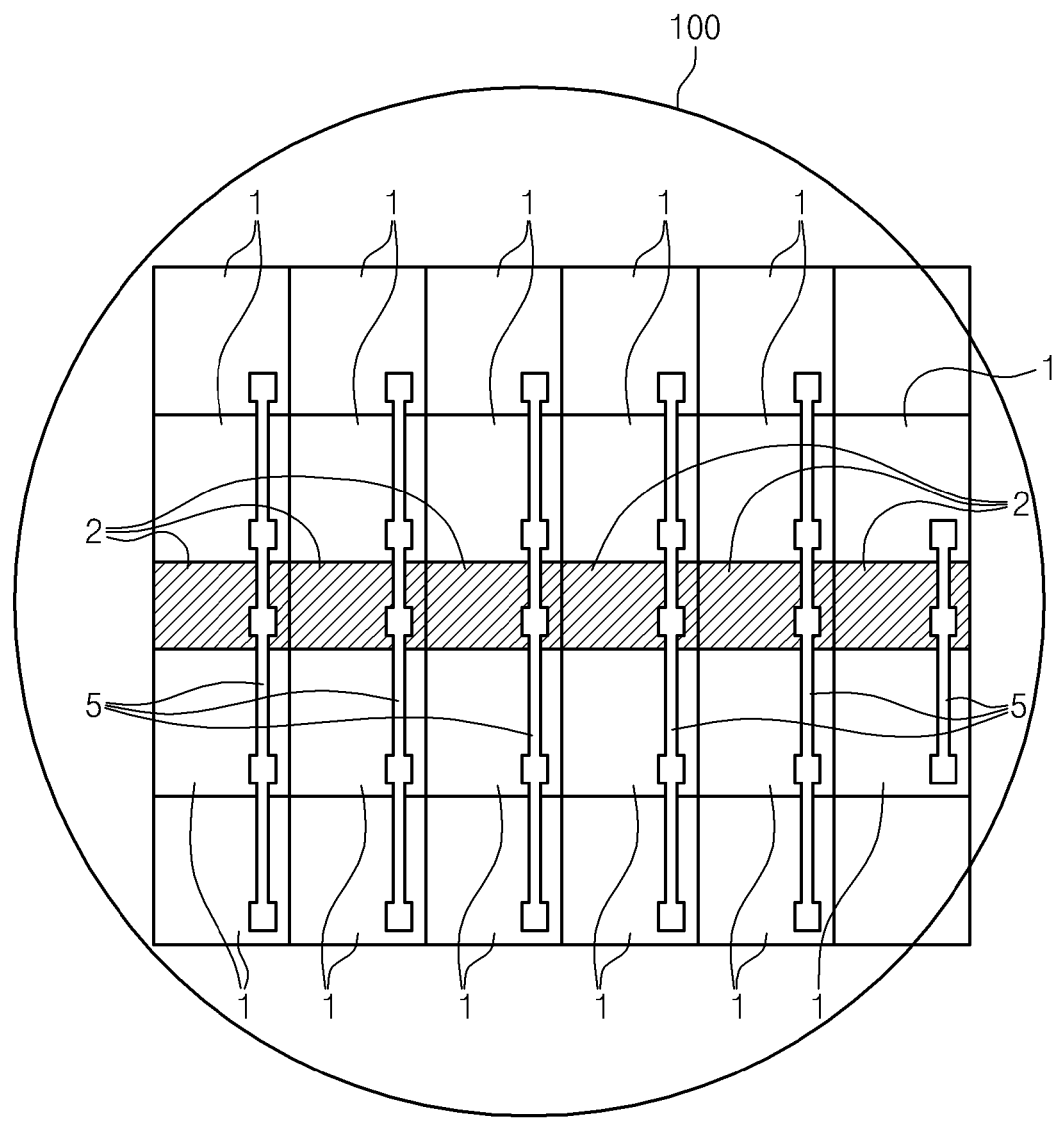
FIG. 4 is a layout diagram further illustrating a wafer provided with the slave and master chips of FIGS. 2 and 3.

FIG. 4 is a plan view illustrating a wafer 100 on which one or more slave chips 1 and master chips 2 of FIGS. 2 and 3 have been fabricated. Referring to FIG. 4, the slave chips 1 have a rectangular shape and are arranged on the wafer 100 on both sides of a centrally located master chip 2. That is, in the illustrated example of FIG. 4 a lateral row of master chips 2 is fabricated in a center region of the wafer 100, wherein multiple slave chips 1 are fabricated in upward and downward extending columnar arrangements from a particular one of the master chips 2.

As one result of this wafer fabrication layout, it is possible to efficiently arrange in respective columnar arrangements one master chip 2 with multiple slave chips 1, despite the fact that the master chip 2 may have a shape that is different from the shape of each slave chip 1. For example, in the illustrated example of FIG. 4, each master chip 2 has a rectangular shape having the same "width" (e.g., the horizontal dimension in FIG. 4) as each slave chip 1, but also having a lesser height (e.g., the vertical dimension in FIG. 4). Thus, despite the fact that master chips 2 and slave chips 1 have different physical dimensions, they may nonetheless be efficiently laid out on a wafer during fabrication.

Further, in the illustrated embodiment of FIG. 4, a power circuit and/or other master control circuit(s) 17 in the master chip 2 may be efficiently interconnected with various slave control circuits 15 in the slave chips 1 via respective columnar arrangements of wires 5 connected by (e.g.) an uppermost conductive layer of each semiconductor device. This type of wiring arrangement 5 may be made "on a wafer level" before the individual semiconductor devices are cut from the wafer 100. Accordingly, multiple columnar arrangements between a master chip 2 and multiple slaves chips 1 may be readily connected via a columnar wiring arrangement 5 extending between connections pads dispose in connection pad area 22 of the master chip 2 and connection pad areas 13 of the respective slave chips 1.

In a case where, like the embodiment of FIG. 4, multiple slave chips 1 and associated master chips 2 are interconnected via respective wiring arrangements 5, a plurality of the slave chips 1 may be efficiently tested using power and control signals provided by one or more master chip(s) 2. Accordingly, it is possible to test each slave chip 1 and each master chip 2 on the wafer level. By identifying a defective or "bad" chips at the wafer level, the relatively expensive fabrication steps associated with assembling and/or packaging various semiconductor devices, particularly multi-chip semiconductor devices, may be omitted for the bad chips. As a result, it is possible manufacture finished semiconductor devices at lower overall batch costs, while improving yield of finished multi-chip memory systems, for example.

That is, since bad slave chips in particular may be identified through wafer level testing, and sorted-out before assembly and packaging processes, finished multi-chip memory systems may be configured with only "good" slave chips 1. This approach enables increased production yield of memory systems with higher confidence in overall memory system reliability characteristics.

Furthermore, since all or most slave chip operations may be tested at the wafer level under the actual control of a corresponding master chip 2, the processes involved in slave chip testing is cheaper, faster and more accurate than simulated test routines provide by external test equipment (e.g., a tester or probe card).

In certain embodiments, the shape(s), arrangement(s), and/or structure(s) of the master and slave chips shown in the accompanying drawings may be variously modified. For example, at least one of the circuits depicted in FIGS. 2 and 3 may be provided at a region or chip different from that depicted in FIGS. 2 and 3. In addition, the master chip 2 may be arranged in relation to and operated during testing in relation to slave chips arranged in two or more rows on the wafer 100.

According to certain embodiments of the inventive concept, a method of fabricating a nonvolatile memory device may include integrating a plurality of memory chips lacking a constituent power circuit with a specialty power chip having one or more power circuits on a wafer. Here, the power chip need not be part of a commercially sellable product. It may only be necessary for the power chip to supply the various control signals and voltages necessary to exercise the functionality of corresponding memory chips during testing. Nonetheless, the power chip may be substantially fabricated on a wafer through many of the fabrication steps used to from the memory chips. This approach is highly cost and testing time effective, as compared with the provision of external testing resources.

For example, a specialty power chip capable of mimicking the operation of certain master control circuits of a master chip may be fabricated on a wafer together with a plurality of chips ultimately implementing a nonvolatile memory device. The power chip may be arranged on a wafer, per the example of FIG. 4, in the same position as the master chip 2, for example. Thereafter, wafer level testing may be performed with a minimum of external test equipment allowing marked reductions in testing complexity, time and costs.

While certain embodiments of the inventive concept have been particularly shown and described, it will be understood by one of ordinary skill in the art that variations in form and detail may be made therein without departing from the scope of the attached claims.

What is claimed is:

1. A semiconductor wafer, comprising:
    a plurality of master chips arranged in a row on the wafer, each master chip including at least one master control circuit that provides at least one control signal; and
    a plurality of slave chips arranged in a column to at least one side of a corresponding master chip among the plurality of master chips, each slave chip including a slave control circuit responsive to the at least one control signal provided by the corresponding master chip,
    wherein the master control circuit is configured to provide the at least one control signal to control testing of the plurality of slave chips during wafer level testing.

2. The semiconductor wafer of claim 1, wherein the plurality of slave chips includes a first plurality of slave chips arranged to one side of the corresponding master chip and a second plurality of slave chips arranged to another side of the corresponding master chip opposite the one side.

3. The semiconductor wafer of claim 1, further comprising:
    a wiring arrangement extending in a columnar direction and connecting the at least one master control circuit to respective slave control circuits of the plurality of slave chips.

4. The semiconductor wafer of claim 3, wherein the wiring arrangement connects the at least one master control circuit through an uppermost conductive layer of the corresponding master chip, and connects respective slave control circuits of the plurality of slave chips through an uppermost conductive layer of each one of the plurality of slave chips.

5. The semiconductor wafer of claim 4, wherein each one of the plurality of master chips comprises a first connection pad area including a plurality of first connection pads connected to the wiring arrangement, and each one of the plurality of slave chips comprises a second connection pad area including a second plurality of connection pads connected to the wiring arrangement.

6. The semiconductor wafer of claim 1 wherein the at least one master control circuit comprises a power supply circuit, and the at least one control signal comprises at least one power supply voltage.

7. A semiconductor wafer, comprising:
    a plurality of master chips arranged in a row on the wafer, each master chip including a power supply circuit that provides a power supply voltage; and
    a plurality of slave chips arranged in a column to at least one side of a corresponding master chip among the plurality of master chips, each slave chip including a memory cell array functionally operative in response to the power supply voltage provided by the corresponding master chip,
    wherein the power supply circuit is configured to provide the power supply voltage to control testing of the plurality of slave chips during wafer level testing.

8. The semiconductor wafer of claim 7, wherein the plurality of slave chips includes a first plurality of slave chips arranged to one side of the corresponding master chip and a second plurality of slave chips arranged to another side of the corresponding master chip opposite the one side.

9. The semiconductor wafer of claim 7, wherein the master chip comprises a master control circuit that provides a control signal, and each slave chip further includes a slave control circuit responsive to the control signal provided by the corresponding master chip during wafer level testing.

10. The semiconductor wafer of claim 9, further comprising:
    a wiring arrangement extending in a columnar direction and connecting the master control circuit to respective slave control circuits of the plurality of slave chips.

11. The semiconductor wafer of claim 10, wherein the wiring arrangement connects the master control circuit through an uppermost conductive layer of the corresponding master chip, and connects respective slave control circuits of the plurality of slave chips through an uppermost conductive layer of each one of the plurality of slave chips.

12. The semiconductor wafer of claim 11, wherein the corresponding master chip comprises a first connection pad area including a plurality of first connection pads connected to the wiring arrangement, and each slave chip in the plurality of slave chips comprises a second connection pad area including a second plurality of connection pads connected to the wiring arrangement.

13. A method of fabricating semiconductor devices, comprising:
fabricating a plurality of master chips arranged in a row on a wafer, wherein each master chip includes a master control circuit that provides a control signal;
fabricating a plurality of slave chips arranged in a column to at least one side of a corresponding master chip among the plurality of master chips on the wafer, wherein each slave chip includes a slave control circuit responsive to the control signal provided by the corresponding master chip, wherein the fabricating the plurality of master chips and fabricating the plurality of slave chips is performed by a common set of fabrication processes; and
testing the plurality of slave chips on a wafer level by operating the corresponding master control circuit.

14. The method of claim 13, wherein the plurality of slave chips are fabricated to include a first plurality of slave chips arranged to one side of the corresponding master chip and a second plurality of slave chips arranged to another side of the corresponding master chip opposite the one side.

15. The method of claim 13, further comprising:
fabricating a wiring arrangement extending in a columnar direction and connecting the master control circuit to respective slave control circuits of the plurality of slave chips.

16. The method of claim 13, wherein the master chip is a power chip and the master control circuit is a power supply circuit, wherein the power chip is used only during wafer level testing of the plurality of slave chips.

17. The method of claim 16, wherein each one of the plurality of slave chips is a nonvolatile memory chip including a memory cell array of nonvolatile memory cells.

18. The method of claim 16, further comprising:
identifying bad slave chips among the plurality of slave chips during the wafer level testing and discarding the bad slave chips before packaging.

19. The method of claim 18, further comprising:
fabricating a wiring arrangement extending in a columnar direction and connecting the power supply circuit to respective driving circuits of the plurality of slave chips.

* * * * *